United States Patent
Ring et al.

(10) Patent No.: US 9,269,662 B2
(45) Date of Patent: Feb. 23, 2016

(54) USING STRESS REDUCTION BARRIER SUB-LAYERS IN A SEMICONDUCTOR DIE

(71) Applicant: Cree, Inc., Durham, NC (US)

(72) Inventors: Zoltan Ring, Chapel Hill, NC (US); Helmut Hagleitner, Zebulon, NC (US); Daniel Namishia, Wake Forest, NC (US); Fabian Radulescu, Chapel Hill, NC (US)

(73) Assignee: Cree, Inc., Durham, NC (US)

( * ) Notice: Subject to any disclaimer, the term of this patent is extended or adjusted under 35 U.S.C. 154(b) by 40 days.

(21) Appl. No.: 13/653,960

(22) Filed: Oct. 17, 2012

(65) Prior Publication Data

US 2014/0103363 A1    Apr. 17, 2014

(51) Int. Cl.
*H01L 23/58* (2006.01)
*H01L 23/48* (2006.01)
*H01L 23/522* (2006.01)
*H01L 49/02* (2006.01)
*H01L 23/532* (2006.01)
(Continued)

(52) U.S. Cl.
CPC .......... *H01L 23/5223* (2013.01); *C23C 28/023* (2013.01); *C23C 28/42* (2013.01); *H01L 23/53252* (2013.01); *H01L 28/65* (2013.01); *H01L 28/75* (2013.01); *H01L 21/022* (2013.01); *H01L 23/3192* (2013.01); *H01L 23/49534* (2013.01); *H01L 23/538* (2013.01); *H01L 33/36* (2013.01); *H01L 33/385* (2013.01); *H01L 2924/0002* (2013.01)

(58) Field of Classification Search
CPC .............. H01L 21/022; H01L 21/4857; H01L 29/49822; H01L 23/538; H01L 23/3192; H01L 23/49534; H01L 33/36; H01L 33/386; H01L 23/5223; H01L 28/65; H01L 28/75; H01L 2924/0002; C23C 29/023; C23C 28/42
USPC .............. 257/13, 32, 79, 81, 91, 99, E33.001, 257/E33.023, E33.028, E33.062, E33.063, 257/731, 732, 420, 448, 635, 781, 782, 783
See application file for complete search history.

(56) References Cited

U.S. PATENT DOCUMENTS

| 5,646,450 A | 7/1997 | Liles et al. |
| 2004/0169189 A1 | 9/2004 | Jeon |

(Continued)

FOREIGN PATENT DOCUMENTS

| JP | H03171630 A | 7/1991 |
| JP | H04087337 A | 3/1992 |

(Continued)

OTHER PUBLICATIONS

Reason for Rejection for Japanese Patent Application No. 2013-168862, mailed Jun. 19, 2015, 9 pages.

(Continued)

*Primary Examiner* — Galina Yushina
(74) *Attorney, Agent, or Firm* — Anthony J. Josephson

(57) ABSTRACT

A semiconductor die, which includes a substrate, a group of primary conduction sub-layers, and a group of separation sub-layers, is disclosed. The group of primary conduction sub-layers is over the substrate. Each adjacent pair of the group of primary conduction sub-layers is separated by at least one of the group of separation sub-layers. As a result, the group of separation sub-layers mitigates grain growth in the group of primary conduction sub-layers.

20 Claims, 9 Drawing Sheets

(51) Int. Cl.
  *C23C 28/02* (2006.01)
  *C23C 28/00* (2006.01)
  *H01L 21/02* (2006.01)
  *H01L 23/538* (2006.01)
  *H01L 33/38* (2010.01)
  *H01L 23/495* (2006.01)
  *H01L 33/36* (2010.01)
  *H01L 23/31* (2006.01)

(56) References Cited

U.S. PATENT DOCUMENTS

| | | | |
|---|---|---|---|
| 2004/0188696 A1* | 9/2004 | Hsing Chen et al. | 257/99 |
| 2005/0040420 A1* | 2/2005 | Okazaki et al. | 257/98 |
| 2005/0053322 A1* | 3/2005 | Jenkins et al. | 385/22 |
| 2005/0194603 A1* | 9/2005 | Slater et al. | 257/98 |
| 2006/0189017 A1* | 8/2006 | Nogami | 438/46 |
| 2006/0226415 A1 | 10/2006 | Nishijima et al. | |
| 2007/0048885 A1* | 3/2007 | Jeon | 438/22 |
| 2008/0182384 A1* | 7/2008 | Hata | 438/458 |
| 2008/0239629 A1 | 10/2008 | Liles et al. | |
| 2010/0078663 A1* | 4/2010 | Shi et al. | 257/98 |
| 2010/0258834 A1* | 10/2010 | Liu et al. | 257/98 |
| 2011/0317733 A1* | 12/2011 | Tani et al. | 372/46.012 |
| 2013/0140592 A1* | 6/2013 | Lee et al. | 257/98 |

FOREIGN PATENT DOCUMENTS

| | | |
|---|---|---|
| JP | H04116829 A | 4/1992 |
| JP | H06120215 A | 4/1994 |
| JP | H08-031689 A | 2/1996 |
| JP | H08335582 A | 12/1996 |
| JP | H10135515 A | 5/1998 |
| JP | 2006173595 A | 6/2006 |

OTHER PUBLICATIONS

Extended European Search Report for European Patent Application No. 13180791.9, mailed Oct. 26, 2015, 8 pages.

* cited by examiner

USING STRESS REDUCTION BARRIER SUB-LAYERS IN A SEMICONDUCTOR DIE

GOVERNMENT SUPPORT

This invention was made with government funds under Contract No. FA8650-11-2-5507 awarded by the U.S. Air Force, Title III Office. The U.S. Government has certain rights in this invention.

FIELD OF THE DISCLOSURE

Embodiments of the present disclosure relate to metallization layers, which are used in the fabrication of integrated circuits.

BACKGROUND

Over the life of an integrated circuit (IC), the IC may be subjected to many thermal cycles, which may induce certain types of stresses. Such stresses may lead to fatigue induced failures in certain structures in the IC. As a result, the reliability of the IC may be significantly reduced. Therefore, to maximize the reliability of an IC, there is a need to mitigate the effects of stresses that are caused by thermal cycles.

SUMMARY

Embodiments of the present disclosure relate to a semiconductor die, which includes a substrate, a group of primary conduction sub-layers, which is over the substrate, and a group of separation sub-layers. Each adjacent pair of the group of primary conduction sub-layers is separated by at least one of the group of separation sub-layers. As a result, the group of separation sub-layers mitigates grain growth in the group of primary conduction sub-layers.

In one embodiment of the present disclosure, the group of primary conduction sub-layers and the group of separation sub-layers provide a multiple sub-layer metallization layer over the substrate. By using multiple primary conduction sub-layers, an effective thickness of the multiple sub-layer metallization layer may be fairly large, while keeping the thickness of each primary conduction sub-layer fairly small. By layering the primary conduction sub-layers, grain boundaries in the primary conduction sub-layers may be substantially frozen, which may reduce stresses that would otherwise be induced from thermal cycling of the semiconductor die. As a result, grain growth in the primary conduction sub-layers is substantially reduced, thereby preventing fatigue induced failures in the semiconductor die. In this regard, the grain growth of conducting metal, such as gold, in each primary conduction sub-layer may be large. By freezing the grain boundaries in the primary conduction sub-layers, the grain growth of the conducting metal is effectively limited. Otherwise, voids or excessive thickening of the conducting metal could occur.

In one embodiment of the present disclosure, the semiconductor die includes the substrate, a first multiple sub-layer metallization layer, which is over the substrate, and a second multiple sub-layer metallization layer, which is over the first multiple sub-layer metallization layer. The first multiple sub-layer metallization layer includes a first group of primary conduction sub-layers and a first group of separation sub-layers. Each adjacent pair of the first group of primary conduction sub-layers is separated by at least one of the first group of separation sub-layers. As a result, the first group of separation sub-layers mitigates grain growth in the first group of primary conduction sub-layers. The second multiple sub-layer metallization layer includes a second group of primary conduction sub-layers and a second group of separation sub-layers. Each adjacent pair of the second group of primary conduction sub-layers is separated by at least one of the second group of separation sub-layers. As a result, the second group of separation sub-layers mitigates grain growth in the second group of primary conduction sub-layers.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

It will be understood that when an element such as a layer, region, or substrate is referred to as being "over," "on," "in," or extending "onto" another element, it can be directly over, directly on, directly in, or extend directly onto the other element or intervening elements may also be present. In contrast, when an element is referred to as being "directly over," "directly on," "directly in," or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

Figure 1:
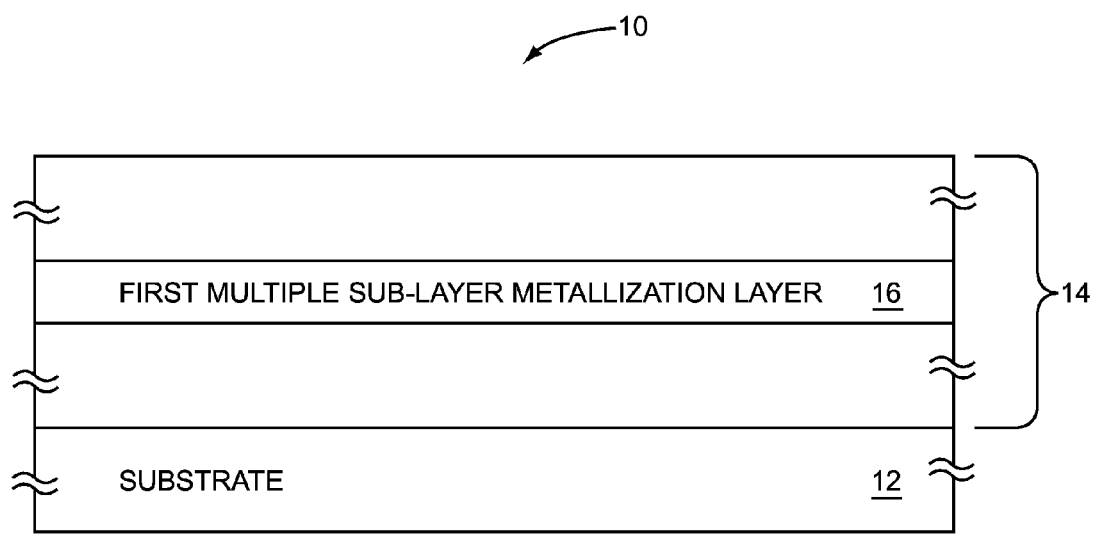
FIG. 1 shows details of a semiconductor die according to one embodiment of the semiconductor die.

FIG. 1 shows details of a semiconductor die 10 according to one embodiment of the semiconductor die 10. The semiconductor die 10 includes a substrate 12 and a multi-layer structure 14, which is on the substrate 12. The multi-layer structure 14 includes a first multiple sub-layer metallization layer 16, which is over the substrate 12. In one embodiment of the semiconductor die 10, the first multiple sub-layer metallization layer 16 is on the substrate 12. In one embodiment of the substrate 12, the substrate 12 includes silicon carbide. In one embodiment of the multi-layer structure 14, the multi-layer structure 14 includes at least one epitaxial layer.

Figure 2:
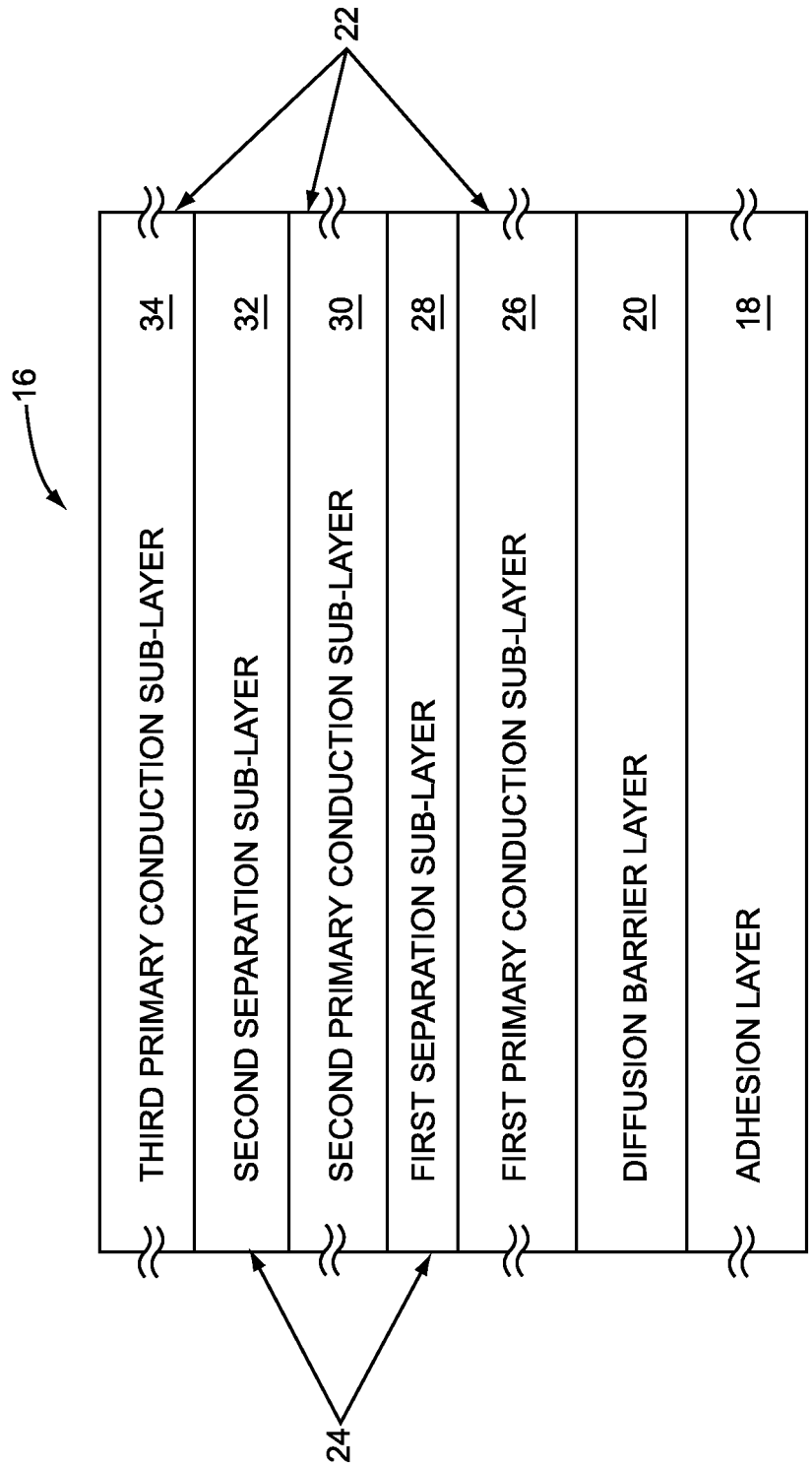
FIG. 2 shows details of a first multiple sub-layer metallization layer illustrated in FIG. 1 according to one embodiment of the first multiple sub-layer metallization layer.

FIG. 2 shows details of the first multiple sub-layer metallization layer 16 illustrated in FIG. 1 according to one embodiment of the first multiple sub-layer metallization layer 16. The first multiple sub-layer metallization layer 16 includes an adhesion layer 18; a diffusion barrier layer 20, which is on the adhesion layer 18; a first group 22 of primary conduction sub-layers, which is over the substrate 12 (FIG. 1); and a first group 24 of separation sub-layers, which is over the substrate 12 (FIG. 1). As such, the first group 22 of primary conduction sub-layers and the first group 24 of separation sub-layers are on the diffusion barrier layer 20. The first multiple sub-layer metallization layer 16 further includes a first primary conduction sub-layer 26, which is on the diffusion barrier layer 20; a first separation sub-layer 28, which is on the first primary conduction sub-layer 26; a second primary conduction sub-layer 30, which is on the first separation sub-layer 28; a second separation sub-layer 32, which is on the second primary conduction sub-layer 30; and a third primary conduction sub-layer 34, which is on the second separation sub-layer 32. As such, the first group 22 of primary conduction sub-layers includes the first primary conduction sub-layer 26, the second primary conduction sub-layer 30, and the third primary conduction sub-layer 34. The first group 24 of separation sub-layers includes the first separation sub-layer 28 and the second separation sub-layer 32.

In general, each adjacent pair of the first group 22 of primary conduction sub-layers is separated by at least one of the first group 24 of separation sub-layers. As a result, the first group 24 of separation sub-layers mitigates grain growth in the first group 22 of primary conduction sub-layers. In one embodiment of the first multiple sub-layer metallization layer 16, the first multiple sub-layer metallization layer 16 includes at least two primary conduction sub-layers 26, 30 and the first separation sub-layer 28. The first separation sub-layer 28 is disposed between the at least two primary conduction sub-layers 26, 30. As such, the first separation sub-layer 28 is adapted to mitigate grain growth in the at least two primary conduction sub-layers 26, 30. In an alternate embodiment of the first multiple sub-layer metallization layer 16, each of first group 24 of separation sub-layers is disposed between each adjacent pair of the at least two primary conduction sub-layers 26, 30, and the first group 24 of separation sub-layers is adapted to mitigate grain growth in the at least two primary conduction sub-layers 26, 30. In another embodiment of the first multiple sub-layer metallization layer 16, one of the at least two primary conduction sub-layers 26, 30 is on the substrate 12 (FIG. 1).

By using multiple primary conduction sub-layers 26, 30, 34, an effective thickness of the first multiple sub-layer metallization layer 16 may be fairly large, while keeping the thickness of each of the primary conduction sub-layers 26, 30, 34 fairly small. By layering the primary conduction sub-layers 26, 30, 34, grain boundaries in the primary conduction sub-layers 26, 30, 34 may be substantially frozen, which may reduce stresses that would otherwise be induced from thermal cycling of the semiconductor die 10 (FIG. 1).

As a result, grain growth in the primary conduction sub-layers 26, 30, 34 is substantially reduced, thereby preventing fatigue induced failures in the semiconductor die 10 (FIG. 1). In this regard, the grain growth of conducting metal, such as gold, in each of the primary conduction sub-layers 26, 30, 34 may be large. By freezing the grain boundaries in the primary conduction sub-layers 26, 30, 34, the grain growth of the conducting metal is effectively limited. Otherwise, voids or excessive thickening of the conducting metal could occur.

In one embodiment of the first primary conduction sub-layer 26, the first primary conduction sub-layer 26 includes gold. In one embodiment of the first primary conduction sub-layer 26, a concentration of gold in the first primary conduction sub-layer 26 exceeds 99 percent. In one embodiment of the second primary conduction sub-layer 30, the second primary conduction sub-layer 30 includes gold. In one embodiment of the second primary conduction sub-layer 30, a concentration of gold in the second primary conduction sub-layer 30 exceeds 99 percent. In one embodiment of the third primary conduction sub-layer 34, the third primary conduction sub-layer 34 includes gold. In one embodiment of the third primary conduction sub-layer 34, a concentration of gold in the third primary conduction sub-layer 34 exceeds 99 percent. In one embodiment of the first group 22 of primary conduction sub-layers, each of the first group 22 of primary conduction sub-layers includes gold.

In a first embodiment of the first group 22 of primary conduction sub-layers, a concentration of gold in each of the first group 22 of primary conduction sub-layers exceeds 90 percent. In a second embodiment of the first group 22 of primary conduction sub-layers, a concentration of gold in each of the first group 22 of primary conduction sub-layers exceeds 90 percent. In a third embodiment of the first group 22 of primary conduction sub-layers, a concentration of gold in each of the first group 22 of primary conduction sub-layers exceeds 92 percent. In a fourth embodiment of the first group 22 of primary conduction sub-layers, a concentration of gold in each of the first group 22 of primary conduction sub-layers exceeds 94 percent. In a fifth embodiment of the first group 22 of primary conduction sub-layers, a concentration of gold in each of the first group 22 of primary conduction sub-layers exceeds 95 percent. In a sixth embodiment of the first group 22 of primary conduction sub-layers, a concentration of gold in each of the first group 22 of primary conduction sub-layers exceeds 96 percent. In a seventh embodiment of the first group 22 of primary conduction sub-layers, a concentration of gold in each of the first group 22 of primary conduction sub-layers exceeds 97 percent. In an eighth embodiment of the first group 22 of primary conduction sub-layers, a concentration of gold in each of the first group 22 of primary conduction sub-layers exceeds 98 percent. In a ninth embodiment of the first group 22 of primary conduction sub-layers, a concentration of gold in each of the first group 22 of primary conduction sub-layers exceeds 99 percent.

In one embodiment of the first group 22 of primary conduction sub-layers, each of the first group 22 of primary conduction sub-layers does not include copper. In one embodiment of the first group 22 of primary conduction sub-layers, each of the first group 22 of primary conduction sub-layers does not include silver. In one embodiment of the first group 22 of primary conduction sub-layers, each of the first group 22 of primary conduction sub-layers does not include aluminum.

In a first embodiment of the first group 22 of primary conduction sub-layers, a thickness of each of the first group 22 of primary conduction sub-layers is less than or equal to about 50,000 Angstroms. In a second embodiment of the first group 22 of primary conduction sub-layers, the thickness of each of the first group 22 of primary conduction sub-layers is less than or equal to about 40,000 Angstroms. In a third embodiment of the first group 22 of primary conduction sub-layers, the thickness of each of the first group 22 of primary conduction sub-layers is less than or equal to about 30,000 Angstroms. In a fourth embodiment of the first group 22 of primary conduction sub-layers, the thickness of each of the first group 22 of primary conduction sub-layers is less than or equal to about 20,000 Angstroms. In a fifth embodiment of the first group 22 of primary conduction sub-layers, the thickness of each of the first group 22 of primary conduction sub-layers is less than or equal to about 10,000 Angstroms. In a sixth embodiment of the first group 22 of primary conduction sub-layers, the thickness of each of the first group 22 of primary conduction sub-layers is less than or equal to about 5,000 Angstroms. In an exemplary embodiment of the first group 22 of primary conduction sub-layers, the thickness of each of the first group 22 of primary conduction sub-layers is equal to about 10,000 Angstroms.

In a first embodiment of the adhesion layer 18, the adhesion layer 18 includes titanium. In a second embodiment of the adhesion layer 18, the adhesion layer 18 includes nickel. In one embodiment of the adhesion layer 18, a thickness of the adhesion layer 18 is equal to about 500 Angstroms. In a first embodiment of the diffusion barrier layer 20, the diffusion barrier layer 20 includes titanium. In a second embodiment of the diffusion barrier layer 20, the diffusion barrier layer 20 includes nickel. In a third embodiment of the diffusion barrier layer 20, the diffusion barrier layer 20 includes platinum. In one embodiment of the diffusion barrier layer 20, a thickness of the diffusion barrier layer 20 is equal to about 100 Angstroms. In an alternate embodiment of the first multiple sub-layer metallization layer 16, the adhesion layer 18 is omitted. In another embodiment of the first multiple sub-layer metallization layer 16, the diffusion barrier layer 20 is omitted. In a further embodiment of the first multiple sub-layer metallization layer 16, both the adhesion layer 18 and the diffusion barrier layer 20 are omitted.

In a first embodiment of the first separation sub-layer 28, the first separation sub-layer 28 includes titanium. In a second embodiment of the first separation sub-layer 28, the first separation sub-layer 28 includes nickel. In a third embodiment of the first separation sub-layer 28, the first separation sub-layer 28 includes platinum. In a first embodiment of the second separation sub-layer 32, the second separation sub-layer 32 includes titanium. In a second embodiment of the second separation sub-layer 32, the second separation sub-layer 32 includes nickel. In a third embodiment of the second separation sub-layer 32, the second separation sub-layer 32 includes platinum. In a first embodiment of the first group 24 of separation sub-layers, at least one of the first group 24 of separation sub-layers includes titanium. In a second embodiment of the first group 24 of separation sub-layers, at least one of the first group 24 of separation sub-layers includes nickel. In a third embodiment of the first group 24 of separation sub-layers, at least one of the first group 24 of separation sub-layers includes platinum.

In an exemplary embodiment of the first separation sub-layer 28, a thickness of the first separation sub-layer 28 is equal to about 100 Angstroms. In an exemplary embodiment of the second separation sub-layer 32, a thickness of the second separation sub-layer 32 is equal to about 100 Angstroms. In an exemplary embodiment of the first group 24 of separation sub-layers, a thickness of each of the first group 24 of separation sub-layers is equal to about 100 Angstroms.

In a first embodiment of the first group 22 of primary conduction sub-layers and the first group 24 of separation sub-layers, the thickness of each of the first group 22 of primary conduction sub-layers is equal to at least two times the thickness of each of the first group 24 of separation sub-layers. In a second embodiment of the first group 22 of primary conduction sub-layers and the first group 24 of separation sub-layers, the thickness of each of the first group 22 of primary conduction sub-layers is equal to at least five times the thickness of each of the first group 24 of separation sub-layers. In a third embodiment of the first group 22 of primary conduction sub-layers and the first group 24 of separation sub-layers, the thickness of each of the first group 22 of primary conduction sub-layers is equal to at least ten times the thickness of each of the first group 24 of separation sub-layers. In a fourth embodiment of the first group 22 of primary conduction sub-layers and the first group 24 of separation sub-layers, the thickness of each of the first group 22 of primary conduction sub-layers is equal to at least twenty times the thickness of each of the first group 24 of separation sub-layers. In a fifth embodiment of the first group 22 of primary conduction sub-layers and the first group 24 of separation sub-layers, the thickness of each of the first group 22 of primary conduction sub-layers is equal to at least fifty times the thickness of each of the first group 24 of separation sub-layers.

In a sixth embodiment of the first group 22 of primary conduction sub-layers and the first group 24 of separation sub-layers, the thickness of each of the first group 22 of primary conduction sub-layers is equal to at least 100 times the thickness of each of the first group 24 of separation sub-layers. In a seventh embodiment of the first group 22 of primary conduction sub-layers and the first group 24 of separation sub-layers, the thickness of each of the first group 22 of primary conduction sub-layers is equal to at least 200 times the thickness of each of the first group 24 of separation sub-layers. In an eighth embodiment of the first group 22 of primary conduction sub-layers and the first group 24 of separation sub-layers, the thickness of each of the first group 22 of primary conduction sub-layers is equal to at least 500 times the thickness of each of the first group 24 of separation sub-layers. In a ninth embodiment of the first group 22 of primary conduction sub-layers and the first group 24 of separation sub-layers, the thickness of each of the first group 22 of primary conduction sub-layers is equal to about 1000 times the thickness of each of the first group 24 of separation sub-layers.

Figure 3:
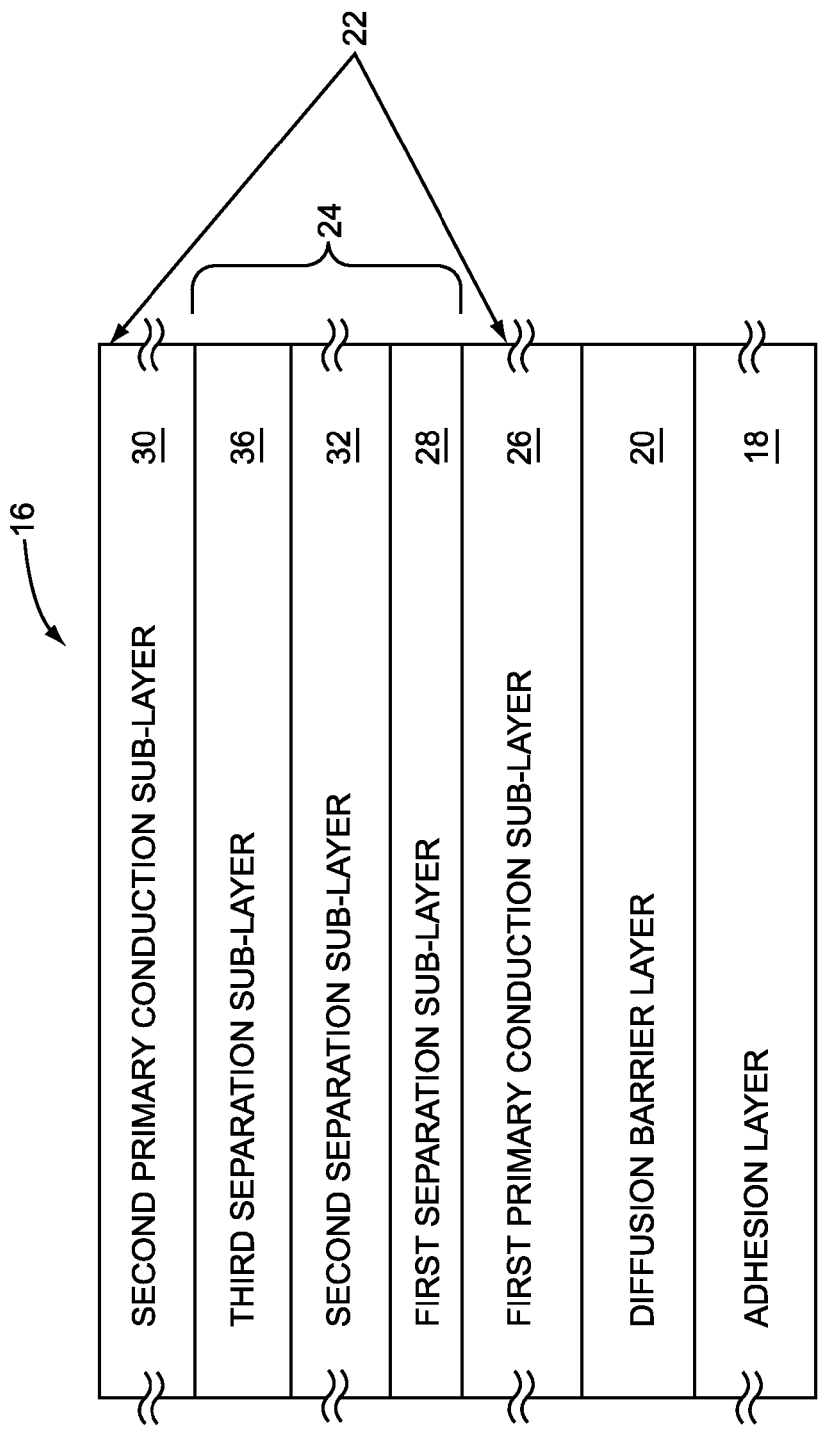
FIG. 3 shows details of the first multiple sub-layer metallization layer illustrated in FIG. 1 according to an alternate embodiment of the first multiple sub-layer metallization layer.

FIG. 3 shows details of the first multiple sub-layer metallization layer 16 illustrated in FIG. 1 according to an alternate embodiment of the first multiple sub-layer metallization layer 16. The first multiple sub-layer metallization layer 16 illustrated in FIG. 3 is similar to the first multiple sub-layer metallization layer 16 illustrated in FIG. 2, except in the first multiple sub-layer metallization layer 16 illustrated in FIG. 3, the third primary conduction sub-layer 34 is omitted and the first group 24 of separation sub-layers further includes a third separation sub-layer 36. In this regard, the second separation sub-layer 32 is on the first separation sub-layer 28, the third separation sub-layer 36 is on the second separation sub-layer 32, and the second primary conduction sub-layer 30 is on the third separation sub-layer 36.

In a first embodiment of the third separation sub-layer 36, the third separation sub-layer 36 includes titanium. In a second embodiment of the third separation sub-layer 36, the third separation sub-layer 36 includes nickel. In a third embodiment of the third separation sub-layer 36, the third separation sub-layer 36 includes platinum.

In an exemplary embodiment of the first primary conduction sub-layer 26, the thickness of the first primary conduction sub-layer 26 is equal to about 25,000 Angstroms. In an exemplary embodiment of the second primary conduction sub-layer 30, the thickness of the second primary conduction sub-layer 30 is equal to about 5,000 Angstroms. In an exemplary embodiment of the first separation sub-layer 28, the thickness of the first separation sub-layer 28 is equal to about 100 Angstroms. In an exemplary embodiment of the second separation sub-layer 32, the thickness of the second separation sub-layer 32 is equal to about 2,500 Angstroms. In an exemplary embodiment of the third separation sub-layer 36, a thickness of the third separation sub-layer 36 is equal to about 100 Angstroms.

Figure 4:
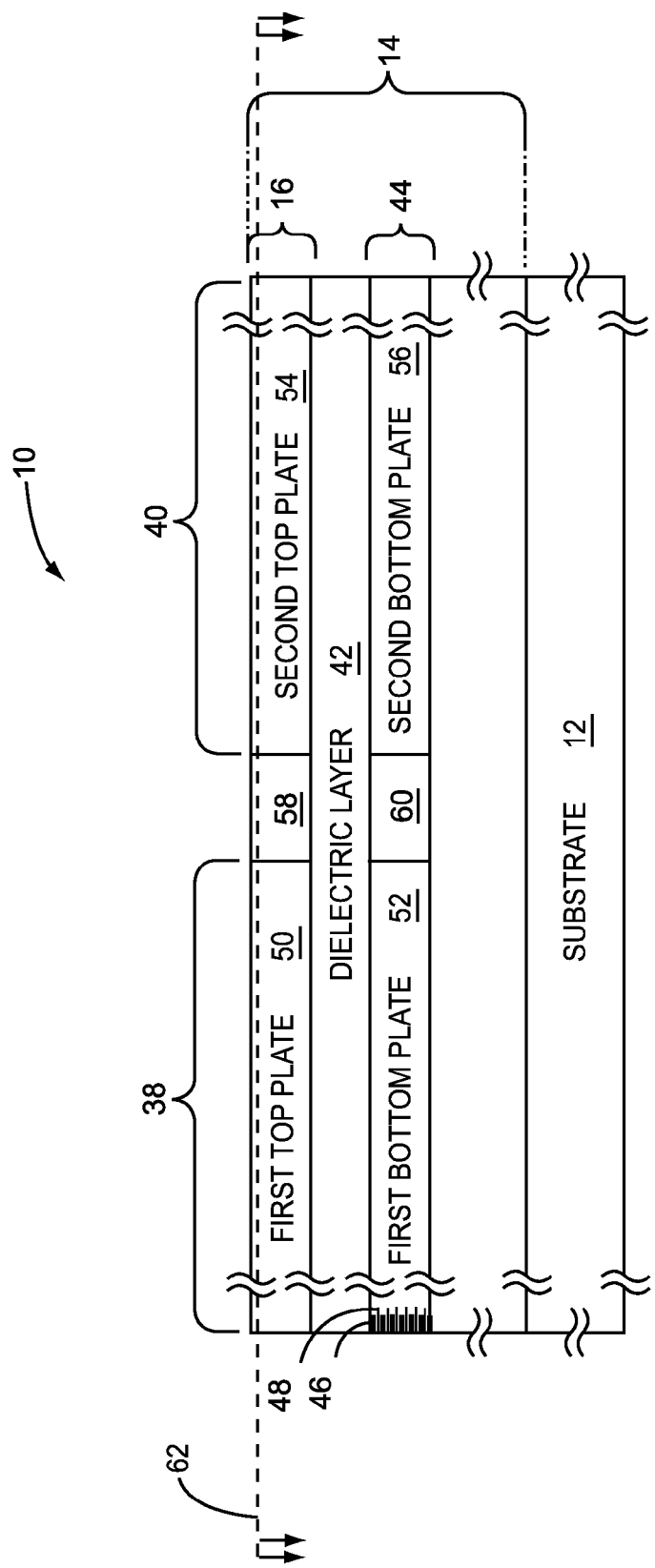
FIG. 4 shows details of the semiconductor die according to an alternate embodiment of the semiconductor die.

FIG. 4 shows details of the semiconductor die 10 according to an alternate embodiment of the semiconductor die 10. The semiconductor die 10 illustrated in FIG. 4 includes a first capacitive element 38 and a second capacitive element 40. As such, the semiconductor die 10 includes the substrate 12 and the multi-layer structure 14, which is on the substrate 12. The multi-layer structure 14 includes the first multiple sub-layer metallization layer 16, a dielectric layer 42, and a second multiple sub-layer metallization layer 44. The second multiple sub-layer metallization layer 44 is over the substrate 12, the dielectric layer 42 is on the second multiple sub-layer metallization layer 44, and the first multiple sub-layer metallization layer 16 is on the dielectric layer 42.

The second multiple sub-layer metallization layer 44 includes a second group 46 of primary conduction sub-layers and a second group 48 of separation sub-layers. As such, the second group 46 of primary conduction sub-layers is over the substrate 12 and the second group 48 of separation sub-layers is over the substrate 12. The second multiple sub-layer metallization layer 44 may be similar in construction to the first multiple sub-layer metallization layer 16. In this regard, each adjacent pair of the second group 46 of primary conduction sub-layers is separated by at least one of the second group 48 of separation sub-layers. As a result, the second group 48 of separation sub-layers mitigates grain growth in the second group 46 of primary conduction sub-layers.

A first top plate 50 of the first capacitive element 38 includes a first portion of the first multiple sub-layer metallization layer 16. A first bottom plate 52 of the first capacitive element 38 includes a first portion of the second multiple sub-layer metallization layer 44. A first portion of the dielectric layer 42 is on the first bottom plate 52 and the first top plate 50 is on the first portion of the dielectric layer 42. As such, the first capacitive element 38 includes the first top plate 50, the first bottom plate 52, and the first portion of the dielectric layer 42. A second top plate 54 of the second capacitive element 40 includes a second portion of the first multiple sub-layer metallization layer 16. A second bottom plate 56 of the second capacitive element 40 includes a second portion of the second multiple sub-layer metallization layer 44. A second portion of the dielectric layer 42 is on the second bottom plate 56 and the second top plate 54 is on the second portion of the dielectric layer 42. As such, the second capacitive element 40 includes the second top plate 54, the second bottom plate 56, and the second portion of the dielectric layer 42.

The first multiple sub-layer metallization layer 16 provides a first electrical interconnect 58 between the first top plate 50 and the second top plate 54. The second multiple sub-layer metallization layer 44 provides a second electrical interconnect 60 between the first bottom plate 52 and the second bottom plate 56. Therefore, the first capacitive element 38 and the second capacitive element 40 are coupled in parallel. As such, the first multiple sub-layer metallization layer 16 provides an electrical interconnect between the first capacitive element 38 and the second capacitive element 40. Similarly, the second multiple sub-layer metallization layer 44 provides an electrical interconnect between the first capacitive element 38 and the second capacitive element 40.

Since the first capacitive element 38 and the second capacitive element 40 are electrical devices, in general, the semiconductor die 10 includes at least two electrical devices. The first multiple sub-layer metallization layer 16 provides at least one electrical interconnect between the two devices. Further, the second multiple sub-layer metallization layer 44 provides at least one electrical interconnect between the two devices. A top-view cross-section 62 of the semiconductor die 10 traverses the first multiple sub-layer metallization layer 16.

Figure 5:
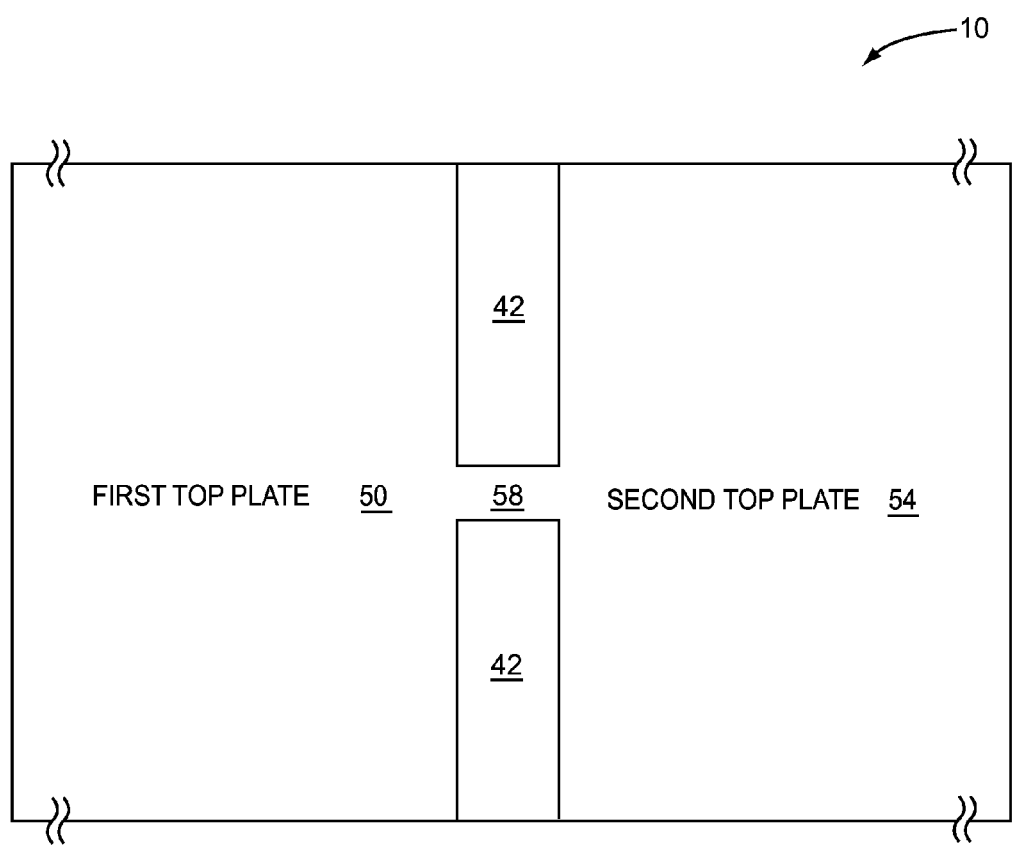
FIG. 5 shows details of the semiconductor die according to an additional embodiment of the semiconductor die.

FIG. 5 shows details of the semiconductor die 10 according to an additional embodiment of the semiconductor die 10. As such, FIG. 5 illustrates the top-view cross-section 62 (FIG. 4) of the semiconductor die 10. The semiconductor die 10 includes the first top plate 50 and the second top plate 54. The first electrical interconnect 58 couples the first top plate 50 to the second top plate 54. Portions of the dielectric layer 42 are visible where the first multiple sub-layer metallization layer 16 is not present.

Figure 6:
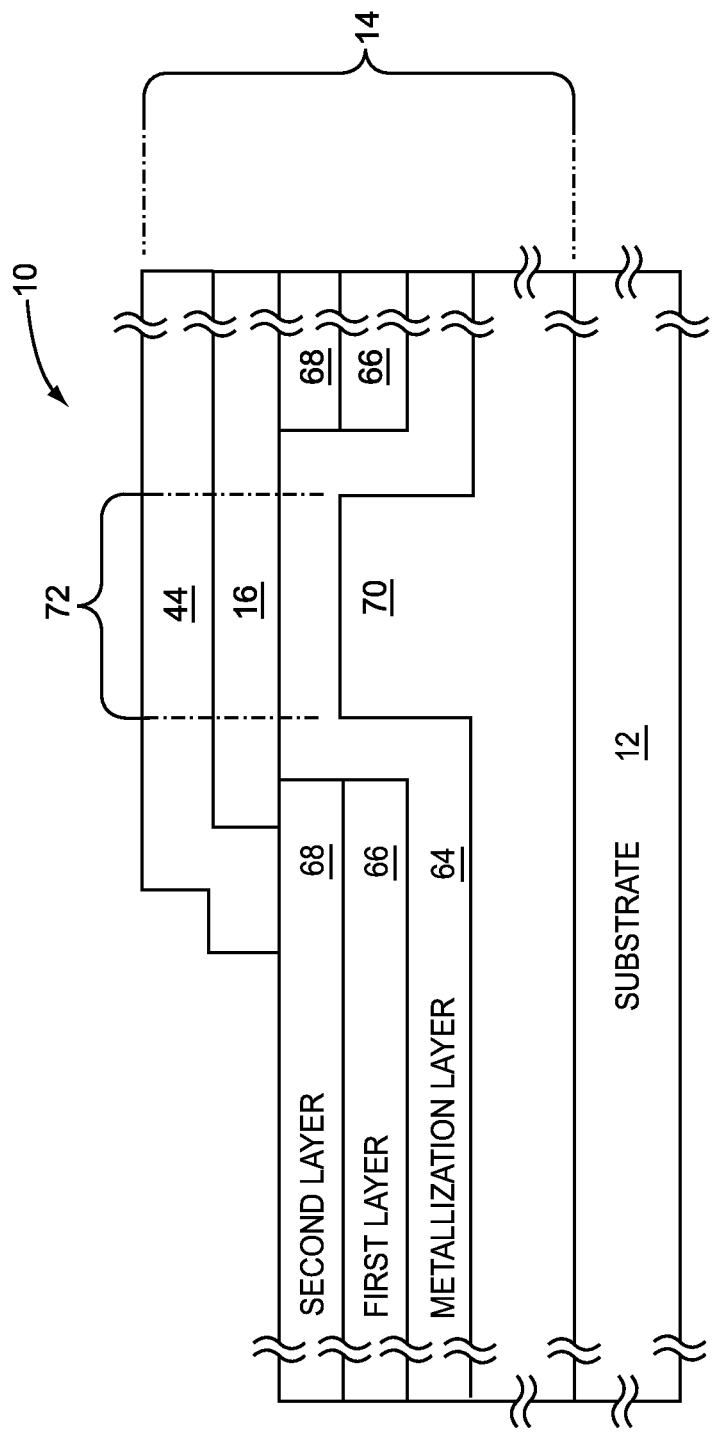
FIG. 6 shows details of the semiconductor die according to another embodiment of the semiconductor die.

FIG. 6 shows details of the semiconductor die 10 according to another embodiment of the semiconductor die 10. The semiconductor die 10 includes the substrate 12 and the multi-layer structure 14, which is on the substrate 12. The multi-layer structure 14 includes a metallization layer 64, a first layer 66, a second layer 68, the first multiple sub-layer metallization layer 16, and the second multiple sub-layer metallization layer 44. The first layer 66 is on a portion of the metallization layer 64. The second layer 68 is over the first layer 66. In one embodiment of the semiconductor die 10, the second layer 68 is on the first layer 66. A first portion of the first multiple sub-layer metallization layer 16 is on the second layer 68. A first portion of the second multiple sub-layer metallization layer 44 is on the first multiple sub-layer metallization layer 16 and a second portion of the second multiple sub-layer metallization layer 44 is on the second layer 68. In one embodiment of the first layer 66, the first layer 66 is an epitaxial layer. In one embodiment of the second layer 68, the second layer 68 is an epitaxial layer.

A Via 70 traverses between the first layer 66 and the second layer 68, such that a portion of the metallization layer 64 traverses between the first layer 66 and the second layer 68. A second portion of the first multiple sub-layer metallization layer 16 is over the Via 70, such that the metallization layer 64 is electrically connected to the first multiple sub-layer metallization layer 16. In this regard, a Via membrane 72, which is over the Via 70, includes the second portion of the first multiple sub-layer metallization layer 16. Further, a third portion of the second multiple sub-layer metallization layer 44 is over the Via 70, such that the Via membrane 72 includes the third portion of the second multiple sub-layer metallization layer 44.

In an alternate embodiment of the semiconductor die 10, at least one additional layer (not shown) is disposed between the first layer 66 and the second layer 68, such that the multi-layer structure 14 includes a group of layers 66, 68 and the Via 70 traverses between two of the group of layers 66, 68. In another embodiment of the semiconductor die 10, the second multiple sub-layer metallization layer 44 is omitted.

Figure 7:
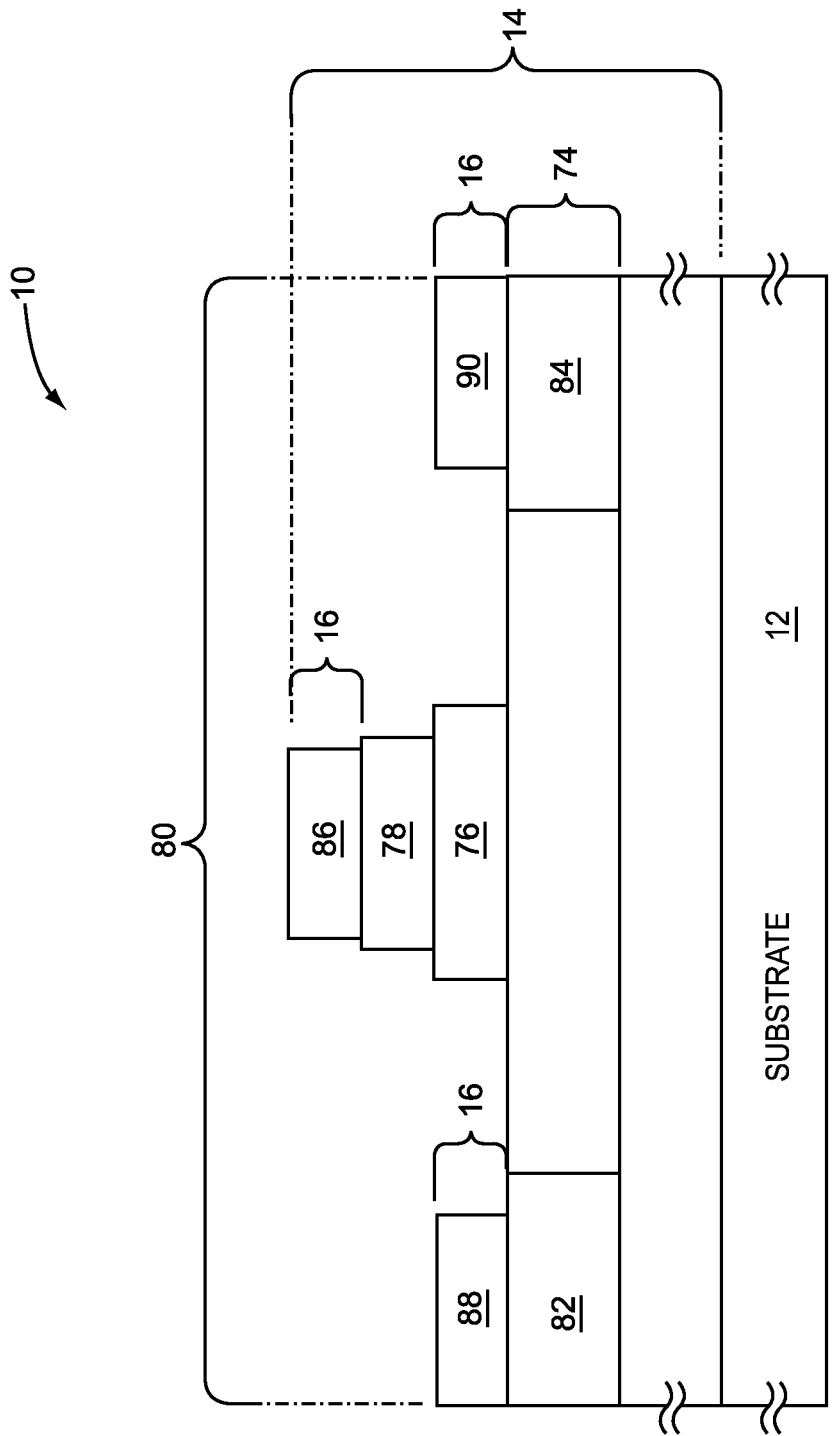
FIG. 7 shows details of the semiconductor die according to a further embodiment of the semiconductor die.

FIG. 7 shows details of the semiconductor die 10 according to a further embodiment of the semiconductor die 10. The semiconductor die 10 includes the substrate 12 and the multi-layer structure 14, which is on the substrate 12. The multi-layer structure 14 includes a channel layer 74, a gate oxide 76, a gate 78, and the first multiple sub-layer metallization layer 16. The semiconductor die 10 further includes a field effect transistor (FET) element 80, which includes the gate 78, a source 82, and a drain 84. The channel layer 74 is over the substrate 12, the gate oxide 76 is on the channel layer 74, and the gate 78 is on the gate oxide 76. The channel layer 74 includes the source 82 and the drain 84, such that the gate 78 is between the source 82 and the drain 84. A first portion of the first multiple sub-layer metallization layer 16 provides a gate ohmic connection 86, which is on the gate 78. A second portion of the first multiple sub-layer metallization layer 16 provides a source ohmic connection 88, which is on the source 82. A third portion of the first multiple sub-layer metallization layer 16 provides a drain ohmic connection 90, which is on the drain 84. In general, the first multiple sub-layer metallization layer 16 provides at least one ohmic connection to at least one of the source 82, the drain 84, and the gate 78.

In alternate embodiments of the semiconductor die 10, in general, the semiconductor die 10 includes at least one semiconductor device (not shown), which may include at least one diode, at least one transistor, at least one photocell, at least one solar cell, at least one thyristor, at least one logic gate, at least one logic device, at least one microprocessor, at least one charge-coupled device, at least one random access memory, at least one read only memory, at least one Hall effect device, the like, or any combination thereof. Further, in alternate embodiments of the first multiple sub-layer metallization layer 16, the first multiple sub-layer metallization layer 16 provides at least one ohmic connection to at least one of the at least one diode, the at least one transistor, the at least one photocell, the at least one solar cell, the at least one thyristor, the at least one logic gate, the at least one logic device, the at least one microprocessor, the at least one charge-coupled device, the at least one random access memory, the at least one read only memory, the at least one Hall effect device, the like, or any combination thereof.

The at least one diode may include at least one rectifier diode, at least one small signal diode, at least one Gunn diode, at least one light emitting diode, at least one PIN diode, at least one Schottky diode, at least one tunnel diode, at least one zener diode, the like, or any combination thereof. The at least one transistor may include at least one bipolar junction transistor (BJT), at least one insulated gate bipolar transistor, at least one FET, at least one metal oxide semiconductor FET (MOSFET), at least one metal-semiconductor FET (MESFET), at least one junction FET (JFET), at least one unijunction transistor, at least one high electron mobility transistor (HEMT), the like, or any combination thereof. The at least one thyristor may include at least one silicon controlled rectifier (SCR), at least one diode for AC (DIAC), at least one triode for AC (TRIAC), the like, or any combination thereof.

Figure 8:
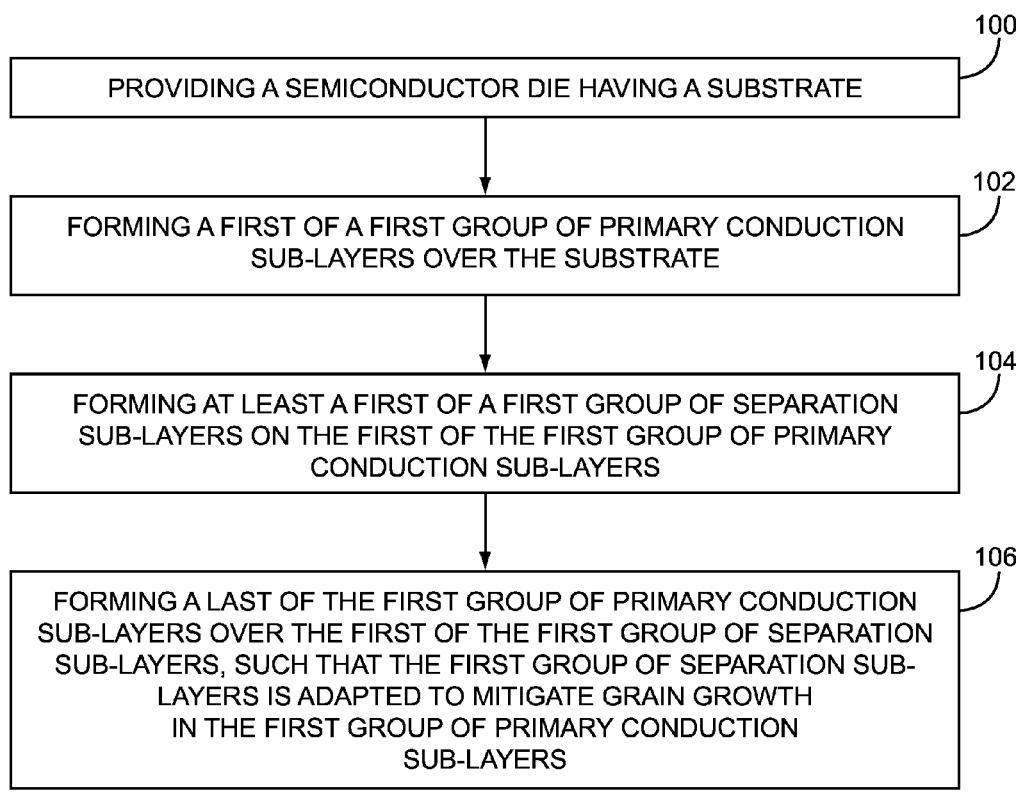
FIG. 8 illustrates a process for providing the semiconductor die illustrated in FIG. 1 according to one embodiment of the process.

FIG. 8 illustrates a process for providing the semiconductor die 10 illustrated in FIG. 1 according to one embodiment of the process. The process begins by providing a semiconductor die 10 having a substrate 12 (Step 100). The process continues by forming a first of the first group 22 of primary conduction sub-layers over the substrate 12 (Step 102). The process proceeds by forming at least a first of the first group 24 of separation sub-layers on the first of the first group 22 of primary conduction sub-layers (Step 104). The process concludes by forming a last of the first group 22 of primary conduction sub-layers over the first of the first group 24 of separation sub-layers, such that the first group 24 of separation sub-layers is adapted to mitigate grain growth in the first group 22 of primary conduction sub-layers (Step 106).

Figure 9:
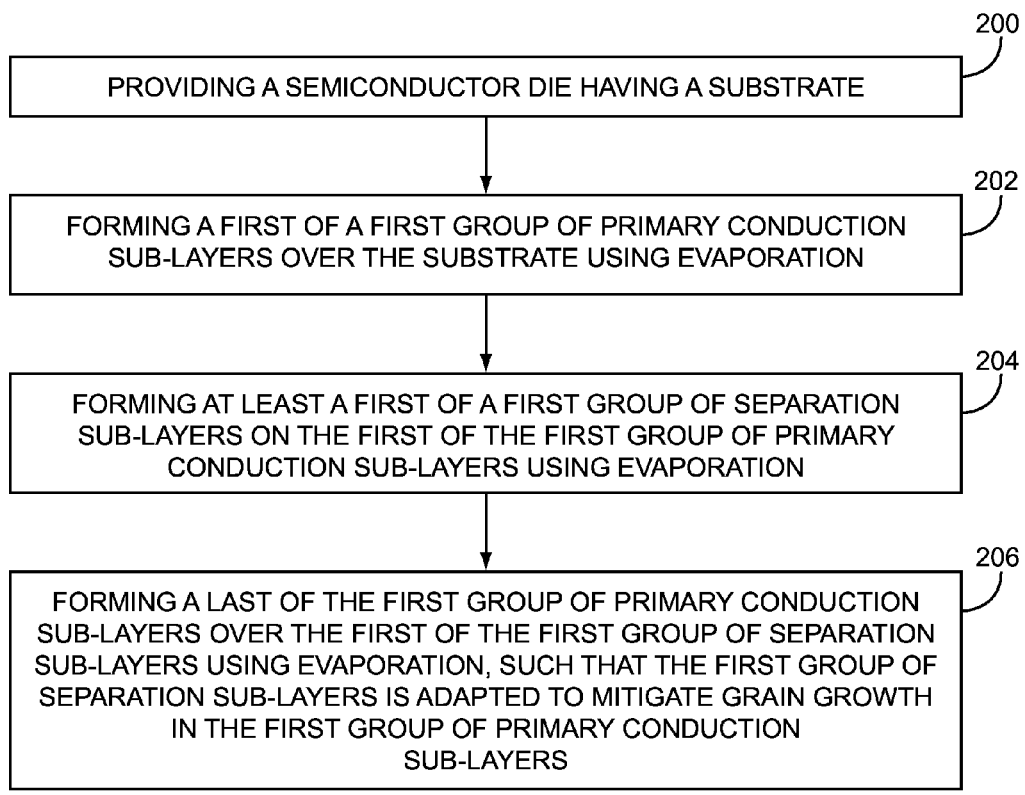
FIG. 9 illustrates a process for providing the semiconductor die illustrated in FIG. 1 according to an alternate embodiment of the process.

FIG. 9 illustrates a process for providing the semiconductor die 10 illustrated in FIG. 1 according to an alternate embodiment of the process. The process begins by providing a semiconductor die 10 having a substrate 12 (Step 200). The process continues by forming a first of the first group 22 of primary conduction sub-layers over the substrate 12 using evaporation (Step 202). The process proceeds by forming at least a first of the first group 24 of separation sub-layers on the first of the first group 22 of primary conduction sub-layers using evaporation (Step 204). The process concludes by forming a last of the first group 22 of primary conduction sub-layers over the first of the first group 24 of separation sub-layers using evaporation, such that the first group 24 of separation sub-layers is adapted to mitigate grain growth in the first group 22 of primary conduction sub-layers (Step 206).

None of the embodiments of the present disclosure are intended to limit the scope of any other embodiment of the present disclosure. Any or all of any embodiment of the present disclosure may be combined with any or all of any other embodiment of the present disclosure to create new embodiments of the present disclosure.

Those skilled in the art will recognize improvements and modifications to the embodiments of the present disclosure. All such improvements and modifications are considered within the scope of the concepts disclosed herein and the claims that follow.

What is claimed is:

1. A semiconductor die comprising:
   a substrate;
   a metallization layer on the substrate;
   a first plurality of primary conduction sub-layers over the substrate;
   a first plurality of separation sub-layers, wherein:
   at least a corresponding one of the first plurality of separation sub-layers is disposed between each adjacent pair of the first plurality of primary conduction sub-layers; and the first plurality of separation sub-layers is adapted to mitigate grain growth in the first plurality of primary conduction sub-layers and the first plurality of primary conduction sub-layers and the first plurality of separation sub-layers provide a first multiple sub-layer metallization layer on the substrate, wherein the first multiple sub-layer metallization layer is on the metallization layer;
   a plurality of epitaxial layers on the metallization layer;
   a via that has a portion that is perpendicular to two of the plurality of epitaxial layers, where a portion of the metallization layer along the via traverses between the two of the plurality of epitaxial layers; and
   a via membrane on the via where the via membrane comprises a portion of the first multiple sub-layer metallization layer.

2. The semiconductor die of claim 1 wherein each of the first plurality of primary conduction sub-layers comprises gold.

3. The semiconductor die of claim 2 wherein a concentration of gold in each of the first plurality of primary conduction sub-layers exceeds 99 percent.

4. The semiconductor die of claim 1 wherein each of the first plurality of primary conduction sub-layers does not comprise copper.

5. The semiconductor die of claim 1 wherein each of the first plurality of primary conduction sub-layers does not comprise silver.

6. The semiconductor die of claim 1 wherein each of the first plurality of primary conduction sub-layers does not comprise aluminum.

7. The semiconductor die of claim 1 wherein at least one of the first plurality of separation sub-layers comprises nickel.

8. The semiconductor die of claim 1 wherein at least one of the first plurality of separation sub-layers comprises platinum.

9. The semiconductor die of claim 1 wherein at least one of the first plurality of separation sub-layers comprises titanium.

10. The semiconductor die of claim 1 wherein a thickness of each of the first plurality of primary conduction sub-layers is equal to at least ten times a thickness of each of the first plurality of separation sub-layers.

11. The semiconductor die of claim 1 wherein a thickness of each of the first plurality of primary conduction sub-layers is equal to at least twenty times a thickness of each of the first and second pluralities of separation sub-layers.

12. The semiconductor die of claim 1 wherein a thickness of each of the first plurality of primary conduction sub-layers is less than or equal to about 30,000 Angstroms.

13. The semiconductor die of claim 1 wherein a thickness of each of the first plurality of primary conduction sub-layers is less than or equal to about 20,000 Angstroms.

14. The semiconductor die of claim 1 wherein a thickness of each of the first plurality of primary conduction sub-layers is less than or equal to about 10,000 Angstroms.

15. The semiconductor die of claim 1 wherein the substrate comprises silicon carbide.

16. The semiconductor die of claim 1 wherein the first multiple sub-layer metallization layer further comprises:
   an adhesion layer; and
   a diffusion barrier layer on the adhesion layer, such that the first plurality of primary conduction sub-layers and the first plurality of separation sub-layers are on the diffusion barrier layer.

17. The semiconductor die of claim 16 wherein the adhesion layer comprises titanium.

18. The semiconductor die of claim 16 wherein the adhesion layer comprises nickel.

19. The semiconductor die of claim 16 wherein the diffusion barrier layer comprises platinum.

20. The semiconductor die of claim 16 wherein the diffusion barrier layer comprises nickel.

* * * * *